(12) United States Patent
Kang et al.

(10) Patent No.: US 9,134,603 B2
(45) Date of Patent: Sep. 15, 2015

(54) PHOTOMASK FOR EXPOSURE AND METHOD OF MANUFACTURING PATTERN USING THE SAME

(71) Applicants: Samsung Display Co., Ltd., Yongin, Gyeonggi-Do (KR); Industry-Academic Cooperation Foundation, Yonsei University, Seoul (KR)

(72) Inventors: Min Kang, Seoul (KR); Bong-Yeon Kim, Seoul (KR); Jeong Won Kim, Seoul (KR); Hyang-Shik Kong, Seongnam-si (KR); Jin Ho Ju, Seoul (KR); Kyoung Sik Kim, Seoul (KR); Seung Hwa Baek, Seoul (KR); Jun Hyuk Woo, Yongin-si (KR); Hyun Joo Lee, Seoul (KR)

(73) Assignees: SAMSUNG DISPLAY CO., LTD. (KR); INDUSTRY-ACADEMIC COOPERATION FOUNDATION, YONSEI UNIVERSITY (KR)

( * ) Notice: Subject to any disclaimer, the term of this patent is extended or adjusted under 35 U.S.C. 154(b) by 236 days.

(21) Appl. No.: 13/856,477

(22) Filed: Apr. 4, 2013

(65) Prior Publication Data

US 2014/0127612 A1  May 8, 2014

(30) Foreign Application Priority Data

Nov. 6, 2012 (KR) .......................... 10-2012-0124718

(51) Int. Cl.
*G03F 1/38* (2012.01)
(52) U.S. Cl.
CPC ........................ *G03F 1/38* (2013.01)

(58) Field of Classification Search
CPC ................................. G03F 1/38; G03F 7/2045
USPC ...................................................... 430/5, 322
See application file for complete search history.

(56) References Cited

U.S. PATENT DOCUMENTS

| | | | |
|---|---|---|---|
| 7,417,219 B2 | 8/2008 | Catrysse et al. | |
| 7,483,130 B2 | 1/2009 | Baumberg et al. | |
| 7,682,755 B2 * | 3/2010 | Luo et al. ........................ | 430/5 |
| 7,993,801 B2 | 8/2011 | Hyde et al. | |

(Continued)

FOREIGN PATENT DOCUMENTS

| | | |
|---|---|---|
| JP | 2005303197 A | 10/2005 |
| JP | 2008275972 A | 11/2008 |

(Continued)

OTHER PUBLICATIONS

J. B. Pendry, "Negative Refraction Makes a Perfect Lens", Physical Review Letters, vol. 85, No. 18, Oct. 30, 2000, pp. 3966-3969.

(Continued)

*Primary Examiner* — Stephen Rosasco
(74) *Attorney, Agent, or Firm* — Cantor Colburn LLP

(57) ABSTRACT

A photomask for exposure includes: a transparent substrate; a light blocking pattern layer positioned on the transparent substrate; a first dielectric layer positioned on the light blocking pattern layer and including a dielectric material; and a negative refractive index layer positioned on the first dielectric layer and including a metal. A surface plasmon quasi-bound mode of the photomask for exposure overlaps a wavelength range of the light source of the light exposer which irradiates light to the photomask for exposure.

20 Claims, 20 Drawing Sheets

(56) References Cited

U.S. PATENT DOCUMENTS

| | | |
|---|---|---|
| 8,052,908 B2 | 11/2011 | Peckerar et al. |
| 8,574,792 B2 * | 11/2013 | Lee et al. .................. 430/5 |
| 2003/0015651 A1 | 1/2003 | Kiguchi et al. |
| 2003/0129545 A1 | 7/2003 | Kik et al. |
| 2009/0203216 A1 | 8/2009 | Mackey |
| 2011/0305994 A1 | 12/2011 | Montelius |
| 2013/0143149 A1 | 6/2013 | Kang et al. |

FOREIGN PATENT DOCUMENTS

| | | |
|---|---|---|
| JP | 2010050431 A | 3/2010 |
| KR | 1020090033726 A | 4/2009 |

OTHER PUBLICATIONS

Nicholas Fang et al., "Sub-Diffraction-Limited Optical Imaging with a Silver Superlens", Science, vol. 308, Apr. 22, 2005, pp. 534-537.

* cited by examiner

FIG.8

Table 1. Values of the Plasma Frequencies $\hbar\omega_p$ (eV)

| Metal | $\hbar\omega_p$ |
|---|---|
| Ag | 9.01 |
| Au | 9.03 |
| Cu | 10.83 |
| Al | 14.98 |
| Be | 18.51 |
| Cr | 10.75 |
| Ni | 15.92 |
| Pd | 9.72 |
| Pt | 9.59 |
| Ti | 7.29 |
| W | 13.22 |

PHOTOMASK FOR EXPOSURE AND METHOD OF MANUFACTURING PATTERN USING THE SAME

This application claims priority to Korean Patent Application No. 10-2012-0124718 filed on Nov. 6, 2012, and all the benefits accruing therefrom under 35 U.S.C. §119, the entire contents of which are incorporated herein by reference.

BACKGROUND (a) Field

The invention relates to a photomask and a method of forming a pattern using the same.

(b) Description of the Related Art

Various processes of manufacturing a semiconductor device or a display device include a process of stacking an etching target material, such as metal, on a substrate, applying a photoresist film, and then performing exposure and development for forming various patterns of the semiconductor device or the display device. Among them, the exposure processing forms a desired pattern from the photoresist film by irradiating light, such as ultraviolet rays, to the photoresist film which is on the stacked etching target material such as by using a light exposer and a photomask for exposure.

Resolution of the light exposer is limited to approximately half of a wavelength of the light used for exposure due to a diffraction limit, so that accuracy and a degree of fineness of a desired pattern are limited.

There is increasing need to form a fine pattern according to the development of display devices, such as liquid crystal display devices, organic light emitting diode display devices, electrophoretic display devices, microelectromechanical ("MEMS") display devices, and three-dimensional ("3D") display devices, as well as relating to several semiconductor devices. Particularly, a fine pattern of a display device in a business field of a flat panel display is desired in order to improve a display quality where a size of a pixel is decreased in order to improve resolution of the flat panel display. However, forming the fine pattern may exceed a limit of resolution of a light exposer used in forming the fine pattern.

According to the desire of improving the display quality and resolution of a display device, a light exposer having high resolution may be used in forming the fine pattern. For example, resolution may be increased by changing a light source used in the light exposer or by increasing a value of the numerical aperture ("NA") of the light exposer. However, to affect the increase in resolution, the light exposer may be remodeled and/or new equipment may be introduced, which undesirably increases a cost and time.

SUMMARY

One or more exemplary embodiment of the invention provides a photomask for exposure having advantages that a fine pattern of high resolution may be formed while exceeding a limit of resolution of a light exposer which irradiates light onto the photomask for exposure. Further, one or more exemplary embodiment of the invention forms a fine pattern with a high quality but without limitations due to a wavelength of light of a light exposer irradiating light onto a photomask or a distance between the photomask and a photoresist film.

An exemplary embodiment of the invention provides a photomask for exposure including: a transparent substrate; a light blocking pattern layer on the transparent substrate; a first dielectric layer on the light blocking pattern layer and including a first dielectric material; and a negative refractive index layer on the first dielectric layer and including a metal. A surface plasmon quasi-bound mode of the photomask for exposure overlaps a wavelength range of a light source of a light exposer which irradiates light onto the photomask for exposure.

The negative refractive index layer may include a metal composite including two or more metals.

Plasma frequencies of the two or more metals may be different from each other.

The wavelength range of the light source may include a range from about 365 nanometers (nm) to about 436 nm.

The photomask for exposure may further include a second dielectric layer on the negative refractive index layer and including a second dielectric material.

Permittivity of the first dielectric layer or the second dielectric layer may be equal to or larger than about 4.

The negative refractive index layer may further include a third dielectric material.

A metal filing factor of the metal of the negative refractive index layer may be about 0.7 to about 0.99.

The photomask for exposure may further include a second dielectric layer on the negative refractive index layer and including a second dielectric material.

Permittivity of the first dielectric layer or the second dielectric layer may be equal to or larger than about 4.

Permittivity of the first dielectric layer may be equal to or larger than about 4.

Permittivity of the second dielectric layer may be equal to or larger than about 4.

Another exemplary embodiment of the invention provides a method of forming a pattern by using a photomask for exposure, the method including: positioning the photomask for exposure between a target substrate on which a photoresist film is coated and a light exposer; and irradiating light of a light source of the light exposure on the photoresist film through the photomask for exposure. The photomask for exposure includes: a transparent substrate; a light blocking pattern layer on the transparent substrate; a first dielectric layer on the light blocking pattern layer and including a first dielectric material; and a negative refractive index layer on the first dielectric layer and including a metal. A surface plasmon quasi-bound mode of the photomask for exposure overlaps a wavelength range of the light source of the light exposer.

The negative refractive index layer may include a metal composite including two or more metals.

The negative refractive index layer may further include a second dielectric material.

Permittivity of the first dielectric layer may be equal to or larger than about 4.

According to one or more exemplary embodiment of the invention, it is possible to form a fine pattern having high resolution exceeding a resolution limit of the light exposer by using the photomask for exposure, and to form a fine pattern with a high quality but without limitations due to a wavelength of light of the light exposer, a distance between the photomask and the photoresist film, and the like.

BRIEF DESCRIPTION OF THE DRAWINGS

The above and other features of the invention will become more apparent by describing in further detail exemplary embodiments thereof with reference to the accompany drawings, in which:

FIG. 8 is a table illustrating metals included in the exemplary embodiment of the photomask for exposure with respect to plasma frequencies.

DETAILED DESCRIPTION

Figure 1:
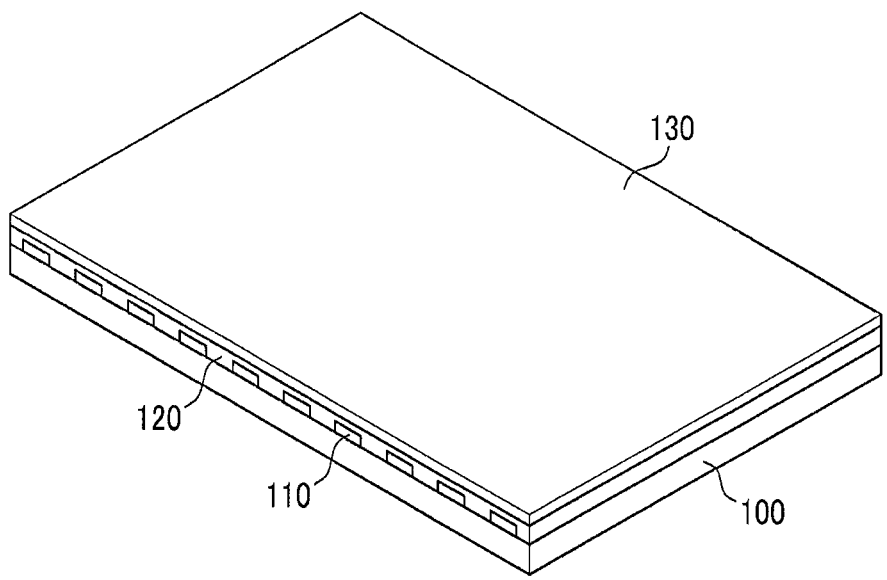
FIGS. 1 and 2 are perspective views of exemplary embodiments of a photomask for exposure according to the invention, respectively.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. As used herein, the term "and/or" includes any and all combinations of one or more of the associated listed items. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

An exemplary embodiment of a photomask for exposure according to the invention will be described with reference to FIGS. 1 to 6.

Figure 2:
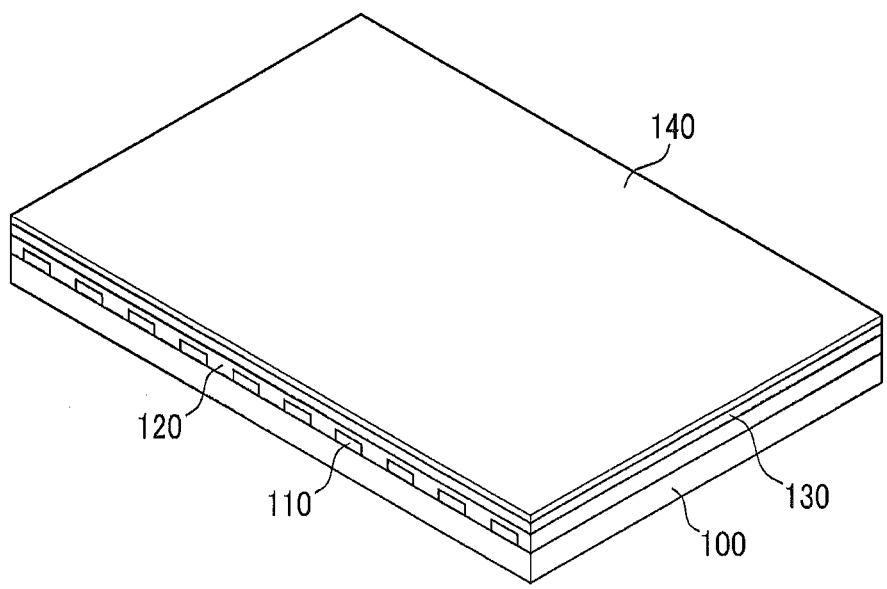

FIGS. 1 and 2 are perspective views of exemplary embodiments of a photomask for exposure according to the invention.

First, referring to FIG. 1, an exemplary embodiment of the photomask for exposure includes a substrate 100 including a transparent material, such as glass or quartz.

A light blocking pattern layer 110 is positioned on the substrate 100. The light blocking pattern layer 110 may block light and include an opaque material, such as metal including chromium (Cr).

A first dielectric layer 120 is positioned on the light blocking pattern layer 110 and the substrate 100. The first dielectric layer 120 includes one or more dielectric material. The dielectric material included in the first dielectric layer 120 may be polymethyl methacrylate ("PMMA") and/or silicon oxide (SiOx).

A negative refractive index layer 130 is positioned on the first dielectric layer 120. The negative refractive index layer 130 includes a conductive material such as a metal material having a negative refractive index. The negative refractive index may be obtained when permittivity $\in$ and/or permeability $\mu$ is a negative number.

The negative refractive index layer 130 includes one or more metal. An example of the metal included in the negative refractive index layer 130 includes silver (Ag), gold (Au), copper (Cu), aluminum (Al), beryllium (Be), chromium (Cr), nickel (Ni), palladium (Pd), platinum (Pt), titanium (Ti) and tungsten (W). The negative refractive index layer 130 may be a substantially flat thin film including the conductive metal. A thickness of the thin film may be significantly smaller than a wavelength of permeating light such that the permeability μ of the conductive metal is negligible.

The negative refractive index layer 130 may include a basic metal, and may also include a metal composite including an additional material, such as metal or a dielectric material, other than the basic metal. In one exemplary embodiment, for example, the metal composite of the negative refractive index layer 130 may be a metal-metal composite including two or more metals or a metal-dielectric composite. An example of the dielectric material includable in the negative refractive index layer 130 includes PMMA and silicon oxide (SiOx).

The exemplary embodiment of the photomask for exposure according to the invention uses a surface plasmon resonance phenomenon generated by collective oscillation of free electrons of the metal included in the negative refractive index layer 130 when light is incident to a boundary between the negative refractive index layer 130 and the first dielectric layer 120.

A surface plasmon wave is a surface electromagnetic wave progressing along a boundary surface between the negative refractive index layer 130 and the first dielectric layer 120, but an electric field progressing in a direction vertical to a surface of the negative refractive index layer 130 is decreased according to an exponential function to form an evanescent wave. The evanescent wave is amplified so as to have a value several tens to several hundreds times larger compared to where the surface plasmon resonance is not generated, thereby transmitting image information in a level of a subwavelength. Here, the image information in the level of the subwavelength is image information in a level of a wavelength equal to or smaller than a guarantee limit region of a light exposer. This may be referred to as a super lens.

According to another exemplary embodiment of a photomask for exposure according to the invention, as illustrated in FIG. 2, a second dielectric layer 140 may be further positioned on the negative refractive index layer 130 of the photomask for exposure illustrated in FIG. 1. The second dielectric layer 140 includes one or more dielectric, such as PMMA or silicon oxide (SiOx). The second dielectric layer 140 may include one dielectric material, or may also include a dielectric composite including two or more dielectric materials, similar to the first dielectric layer 120.

The surface plasma resonance phenomenon may also be generated in a boundary surface of the negative refractive index layer 130 and the second dielectric layer 140.

Figure 3:
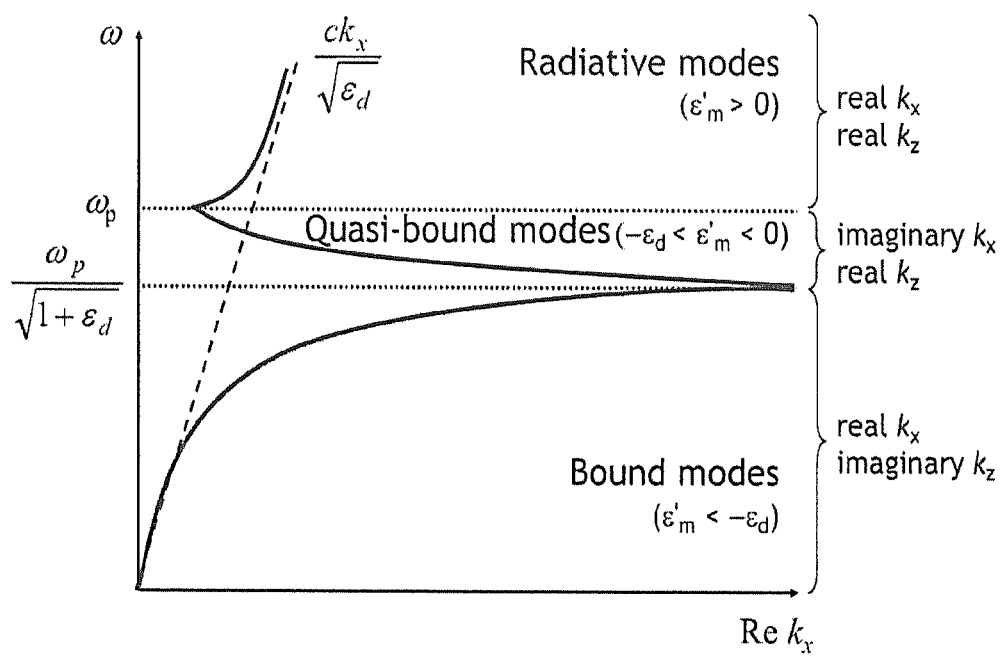
FIG. 3 is a distribution graph of general surface plasmon.

FIG. 3 is a distribution graph of surface plasmon.

In FIG. 3, $k_x$ is a wave vector of progress of the surface plasmon, and $k_z$ is a wave vector in a direction vertical to a boundary surface of metal and a dielectric. Referring to FIG. 3, the distribution graph of the surface plasmon using an actually measured material property value of the metal includes a bound mode, a radiative mode and a quasi-bound mode. The quasi-bound mode in the graph of FIG. 3 is a mode of a region positioned between a first frequency $\omega_p$ and a second frequency $\omega_{sp}$. Here, the first frequency $\omega_p$ is a plasma frequency of the metal, and the second frequency $\omega_{sp}$ may be defined by Equation 1 below.

$$\omega_{sp} = \omega_p/\sqrt{(1+\in_d)} \qquad \text{Equation 1}$$

In Equation 1, $\in_d$ is permittivity of the dielectric that is in contact with the metal.

In the exemplary embodiment of the photomask for exposure according to the invention, the surface plasmon phenomenon of the quasi-bound mode may be used for exposure by adjusting at least one material property of the aforementioned first dielectric layer 120 and negative refractive index layer 130.

When the surface plasmon resonance is in the quasi-bound mode, the image information in the level of the subwavelength transmitted by the evanescent wave passing through the photomask for exposure may be transmitted to a relatively farther distance compared to other modes, so that exposure may also be performed at a relatively far field having a relatively large distance (referred to as an exposure distance) between the photomask for exposure and a photoresist film to be exposed. Accordingly, when the exposure distance is relative large, for example, about 250 micrometers (μm), it is possible to obtain an excellent exposure quality having a degree similar to that of contact exposure which has the exposure distance of zero (0). That is, even when the exposure distance is not 0, it is possible to overcome a general diffraction limit of the light exposer, thereby forming a fine pattern exceeding a resolution limit of the light exposer.

Further, when the exposure distance is decreased, the image information may be more accurately transmitted to the photoresist film through the photomask, so that it is possible to more accurately form a fine pattern having a high quality. That is, when the exposure is performed by using a proximity light exposer together with the exemplary embodiment of the photomask for exposure according to the invention, the image information having a high quality may be irradiated to the photoresist film having a degree similar to that of the contact-type light exposer having an exposure distance of 0.

The aforementioned effect will be described with reference to FIGS. 4 to 6.

Figure 4:
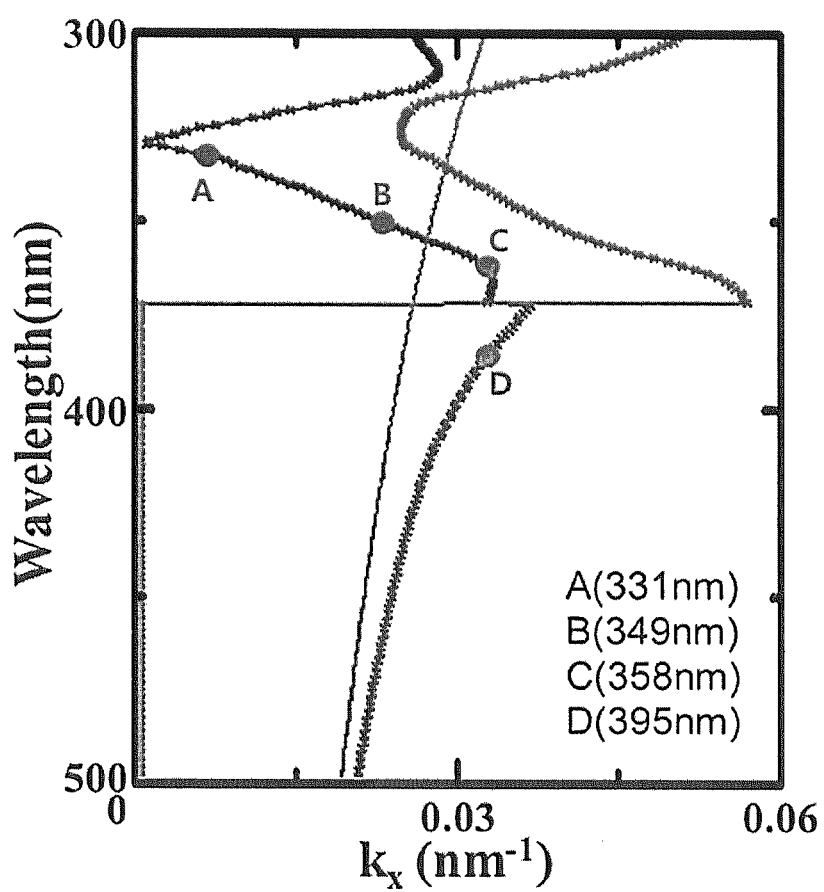
FIG. 4 is a distribution graph of an experimental surface plasmon, with reference to FIG. 3.
Figure 5:
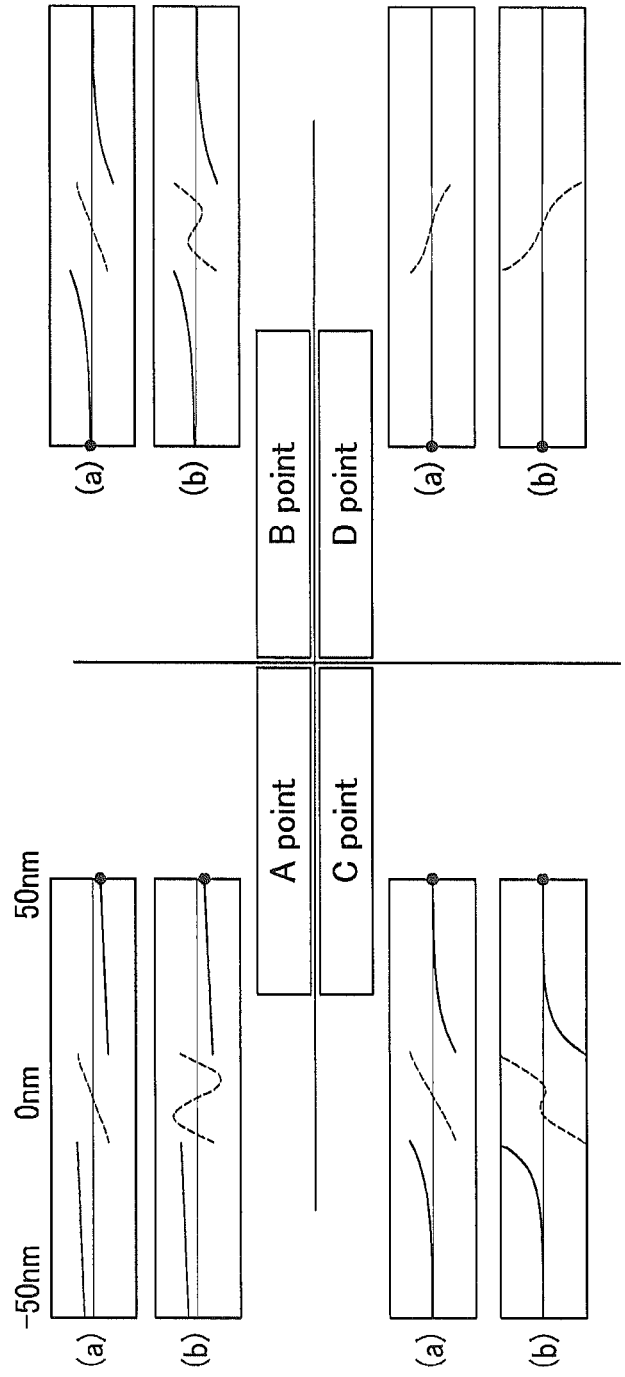
FIG. 5 is a graph illustrating sizes of pointing vectors in light progress directions for respective points of the distribution graph of the surface plasmon of FIG. 4.
Figure 6:
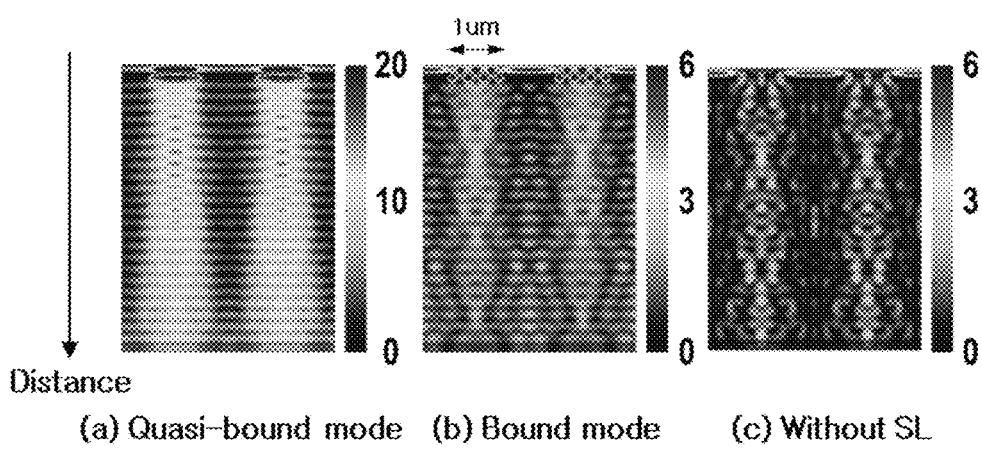
FIG. 6 shows photographs illustrating results of simulations showing progress of light and sizes of energy of the light for several modes of the surface plasmon shown in FIG. 4.

FIG. 4 is a distribution graph of surface plasmon experimentally obtained by using silver (Ag) as metal and PMMA as a dielectric, FIG. 5 is a graph illustrating sizes of pointing vectors in light progress directions for respective points A, B, C and D of the distribution graph of the surface plasmon of FIG. 4, and FIG. 6 includes photographs illustrating results of simulations illustrating progress of light and sizes of energy of the light for several modes of the surface plasmon shown in FIG. 4.

In FIGS. 4 and 5, points A, B and C are points included in the quasi-bound mode of the surface plasmon, and point D is a point included in the bound mode. In the quasi-bound mode, when a plasma frequency of the surface plasmon is large, the points are positioned in a left side of the graph illustrated in FIG. 4, and when a plasma frequency of the surface plasmon is small, the points are positioned in a right side of the graph.

A solid line in the graphs of FIG. 5 represents intensity of light transmitted to a distance of 50 nanometers (nm). It is represented that as the solid line is positioned at a relatively far distance in a vertical direction from a horizontal axis, light having large energy reaches a far distance. Referring to the graphs for point A, point B and point C, it can be seen that the light is transmitted to a significantly further distance in the quasi-bound mode compared to point D in the bound mode. More particularly, observing a size of the light at a moment at which the light passes through the super lens of the photomask, the size of the light in the quasi-bound mode of the surface plasmon is about 1,000 times to about 100,000 times that of the light of the bound mode.

Referring to FIG. 6, it can be seen that the light having large energy is transmitted to a relatively far distance in the quasi-bound mode (a), compared to that of the bound mode (b) of the surface plasmon and when the super lens (SL) is not used (c).

As described above, when the exemplary embodiment of the photomask for exposure according to the invention using the surface plasmon phenomenon of the quasi-bound mode is used, it is possible to form a fine pattern having an excellent quality even where the exposure distance between the photomask for exposure and a photoresist film to be exposed is larger than 0. Particularly, at the points having the large plasma frequency positioned at the left side in FIG. 4, the image information may be transmitted to a relatively far distance. Accordingly, by adjusting the material property of the first dielectric layer 120 or the negative refractive index layer 130 of the exemplary embodiment of the photomask for exposure according to the invention, a wavelength range of the light of the light exposer corresponds to a leftmost portion in the graph of the quasi-bound mode of FIG. 4, so that it is possible to accurately form a fine pattern even when an exposure is performed at the exposure distance is larger than 0.

Particularly, when the exemplary embodiment of the photomask for exposure according to the invention is used, it is possible to accurately form a fine pattern exceeding a resolution limit of the light exposer without replacement of the light exposer. This will be described with reference to FIG. 7.

Figure 7:
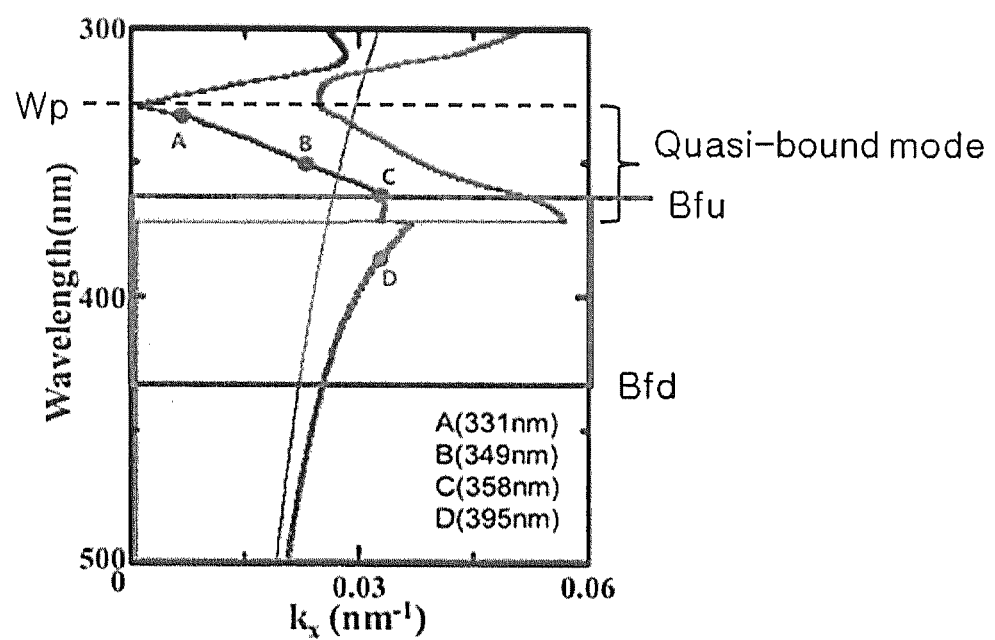
FIG. 7 is a distribution graph of surface plasmon of metal included in an exemplary embodiment of a photomask for exposure according to the invention.

FIG. 7 is a distribution graph of surface plasmon of metal included in the exemplary embodiment of the photomask for exposure according to the invention.

In FIG. 7, a region from a first exposure wavelength Bfd to a second exposure wavelength Bfu is one example of a wavelength range of light used in a general light exposer. In the illustrated exemplary embodiment, for example, the first exposure wavelength Bfd may be about 436 nm, and the second exposure wavelength Bfu may be about 365 nm.

The light exposer may use a light source of a complex wavelength emitting light in two or more wavelength ranges in the region from the first exposure wavelength Bfd to the second exposure wavelength Bfu, or may use a light source of a single wavelength emitting light in a short wavelength range. In the illustrated exemplary embodiment, for example, the light exposer may use light in at least one wavelength range among light about 365 nm, light about 405 nm and light about 436 nm.

The wavelength ranges Bfd to Bfu of the light used in the light exposer overlaps the quasi-bound mode of the surface plasmon of the photomask, so that it is possible to accurately form a fine pattern even at the exposure distance larger than 0. FIG. 7 illustrates an example in which only point C of FIGS. 4 and 5 is included in the wavelength ranges Bfd to Bfu the light used in the light exposer. When the light exposer uses light of complex wavelengths of 365 nm, 405 nm and 436 nm, it is also possible to form a pattern having an approximate size of 1 μm in the exposure performed at the exposure distance of 10 μm.

Referring to FIG. 7, when the exposure is performed through the light exposer using light in a wavelength range smaller than 365 nm or the graph of the quasi-bound mode is adjusted so that other points A and B of the quasi-bound mode are included in the wavelength range Bfd to Bfu of the light used in the light exposer, it is possible to accurately form a fine pattern even at a relatively far exposure distance without replacement of the light exposer.

The material property of a dielectric layer, e.g., the first dielectric layer 120 in FIG. 1 or further including the second dielectric layer 140 in FIG. 2, and/or the negative refractive index layer 130 of an exemplary embodiment of the photomask for exposure according to the invention may be adjusted so as to perform the exposure in the quasi-bound mode of the surface plasmon. Particularly, the exemplary embodiment of the photomask for exposure according to the invention may make the wavelength range of the light of the light exposer be maximally included in the quasi-bound mode by adjusting at least one of the first frequency $\omega_p$ and the second frequency $\omega_{sp}$ in the aforementioned distribution graph illustrated in FIG. 3. That is, even when the wavelength range of the light source of the generally used light exposer is about 365 nm to about 436 nm, the exemplary embodiment of the photomask may use the quasi-bound mode to perform the exposure and achieve an accurately formed fine pattern.

First, an exemplary embodiment of a method of making the quasi-bound mode of the surface plasmon of a photomask overlap the wavelength range of the light used in the light exposer by adjusting the material property of the negative refractive index layer 130 of the exemplary embodiment of the photomask for exposure according to the invention will be described with reference to FIGS. 8, and 9A to 9D, together with the aforementioned drawings.

FIG. 8 is a table illustrating metals includable in the exemplary embodiment of the photomask for exposure according to the invention and respective plasma frequencies of those metals. As illustrated in FIG. 8, the metals have an inherent plasma frequency according to an inherent property. The metals in FIG. 8 may be considered a basic metal of the negative refractive index layer 130.

The negative refractive index layer 130 of the exemplary embodiment of the photomask for exposure according to the invention may include a metal composite including an additional material, other than the basic metal. More particularly, exemplary embodiments of the negative refractive index layer 130 may include the metal composite having two or more metals having different plasma frequencies and the choice of metal and/or a combination ratio of the metals is adjusted, so that it is possible to adjust the positions of the first frequency $\omega_p$ and the second frequency $\omega_{sp}$ of the quasi-bound mode. Accordingly, the range of the quasi-bound mode may be shifted or expanded in the distribution graph of the surface plasmon.

In one exemplary embodiment, for example, when the negative refractive index layer 130 is formed by mixing silver (Ag) having the plasma frequency of about 9.01 electron volts (eV) and gold (Au) having the plasma frequency of about 9.03 eV or by mixing silver (Ag) and titanium (Ti) having the plasma frequency of about 7.29 eV, it may be designed so that the distribution graph of the surface plasma is shifted or expanded, and thus the quasi-bound mode overlaps the wavelength range of about 365 nm to about 436 nm of the light used in the light exposer.

In addition, when the negative refractive index layer 130 is formed by mixing various metals in various ratios, the quasi-bound mode of the surface plasmon overlaps the wavelength range of the light of the light exposer, so that it is possible to accurately form a fine pattern by transmitting the image information to a relatively far distance through the exemplary embodiment of the photomask for exposure without replacement of the light exposer.

The negative refractive index layer 130 of another exemplary embodiment of the photomask for exposure according to the invention may include a dielectric as an additional material, other than the metal. More particularly, exemplary embodiments of the negative refractive index layer 130 may include one or more metal and one or more dielectric material. As described above, the negative refractive index layer 130 includes the metal-dielectric composite, so that it may be designed so that the quasi-bound mode overlaps the wavelength range of the light used in the light exposer by shifting or expanding the distribution graph of the surface plasma. Here, a degree of the change of the distribution graph of the surface plasma may be changed according to a condition, such as the specific chosen metal or dielectric material included in the negative refractive index layer 130 and/or a metal filling factor of the contained metal.

This will be described with reference to FIGS. 9A to 9D.

Figure 9A:
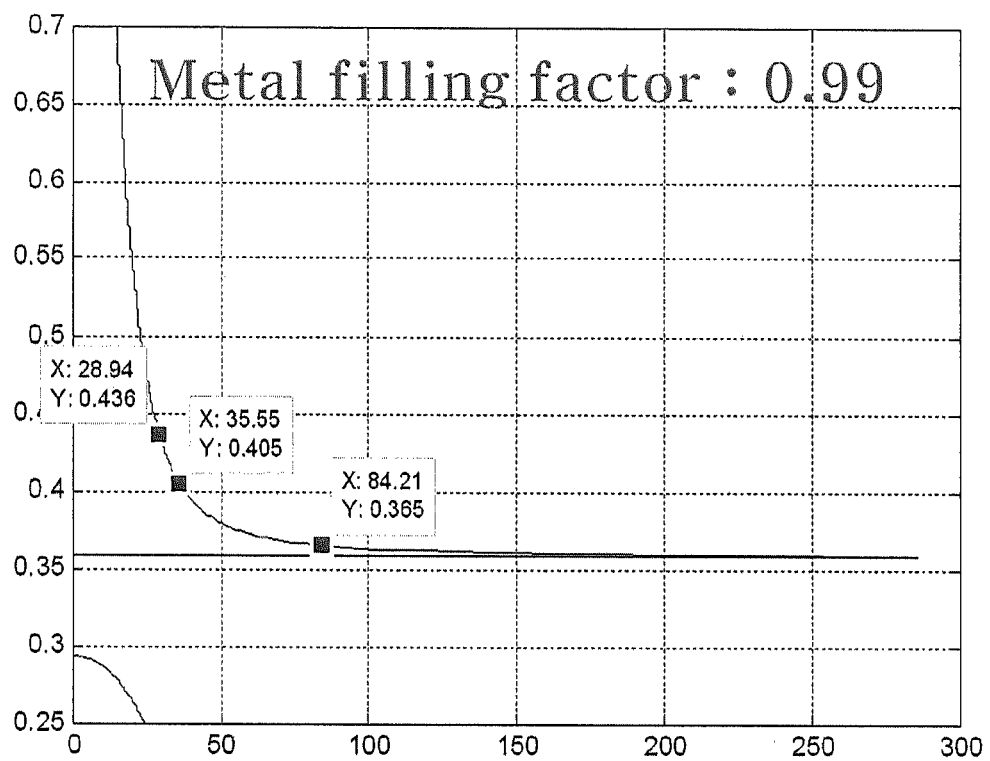
FIGS. 9A to 9D are distribution graphs of surface plasmon according to metal filing factors of a metal in a metal-dielectric composite included in an exemplary embodiment of the photomask for exposure according to the invention.
Figure 9B:
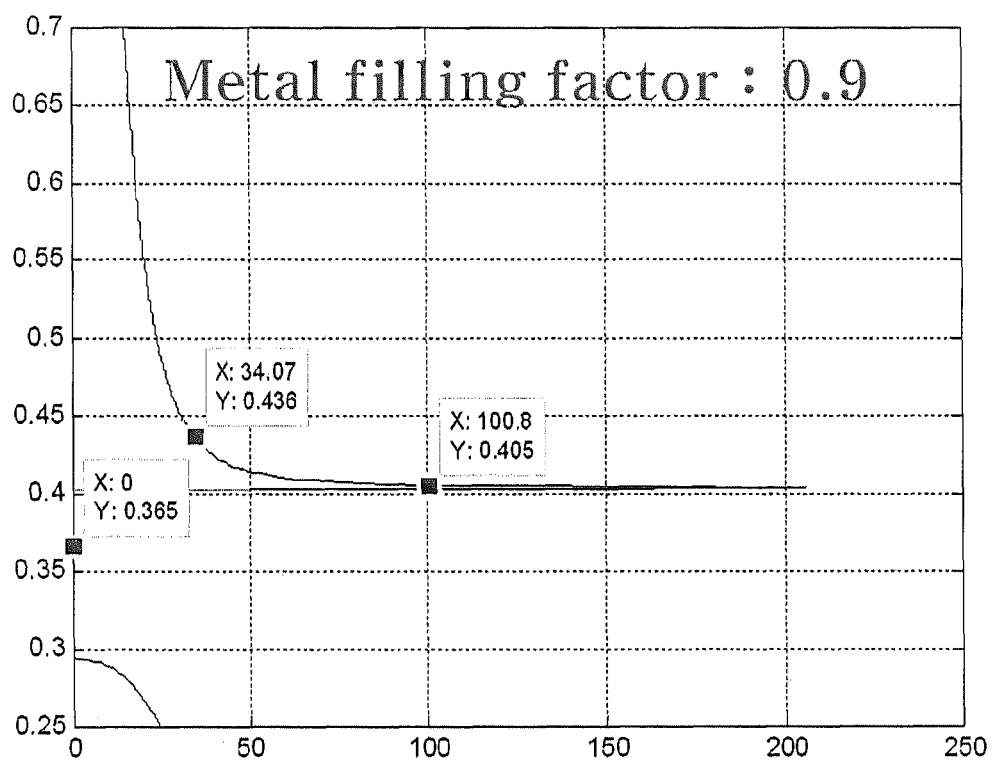
Figure 9C:
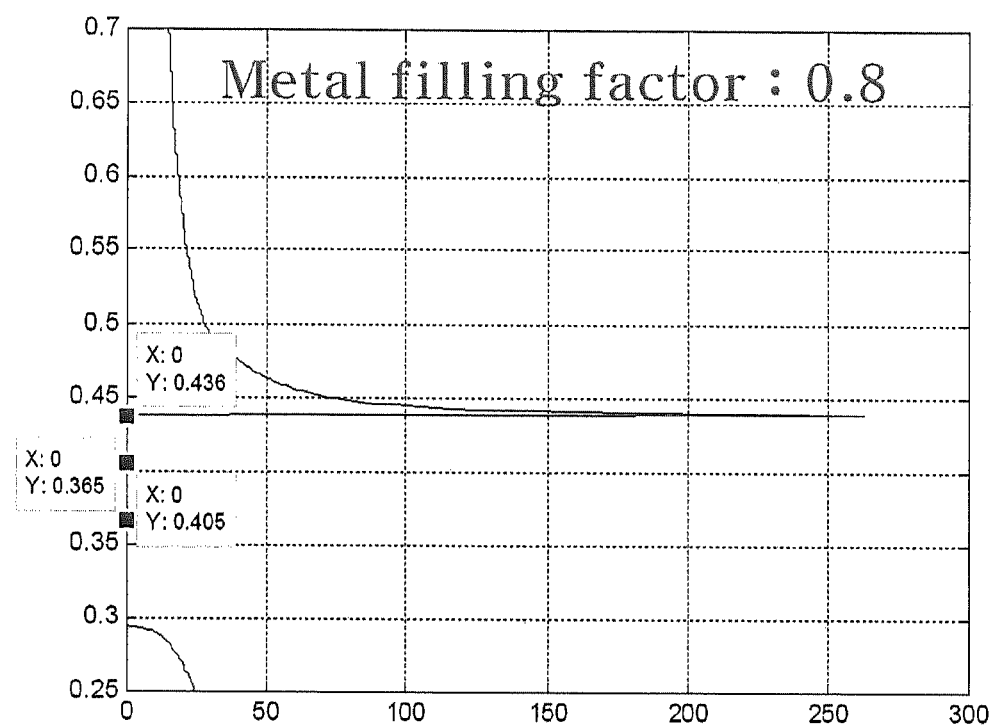
Figure 9D:
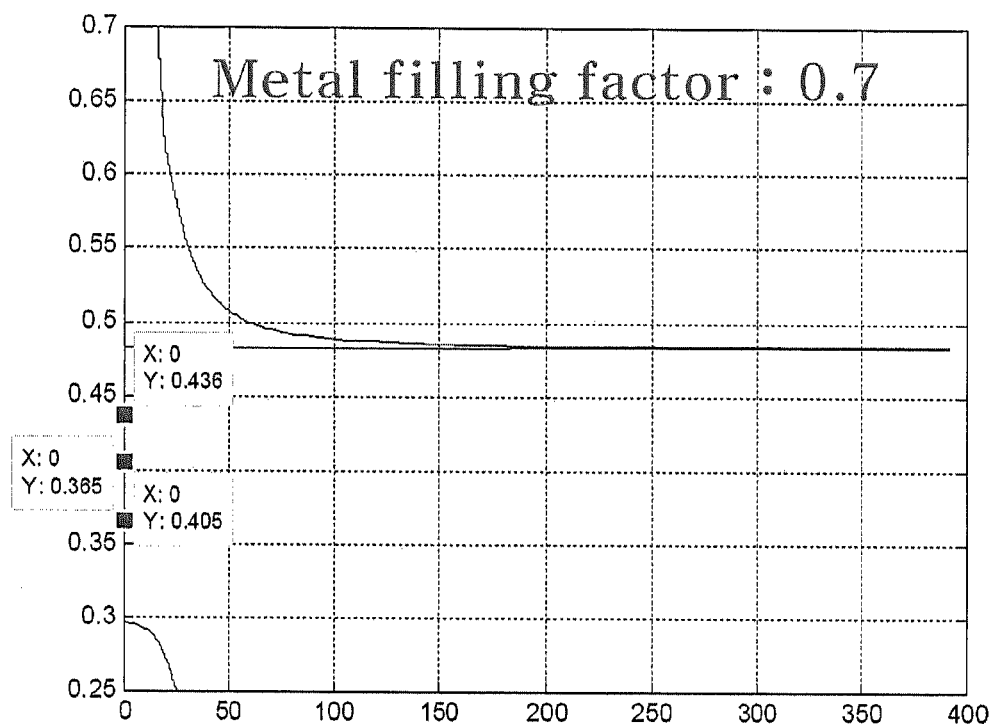

FIGS. 9A to 9D are distribution graphs of the surface plasmon according to a metal filling factor of the metal in the metal-dielectric composite included in the exemplary embodiment of the photomask for exposure according to the invention, respectively. FIG. 9A illustrates a metal filing factor of the metal contained in the negative refractive index layer 130 is 0.99, FIG. 9B illustrates a metal filing factor of the metal contained in the negative refractive index layer 130 is 0.9, FIG. 9C illustrates a metal filing factor of the metal contained in the negative refractive index layer 130 is 0.8, and FIG. 9D illustrates a metal filing factor of the metal contained in the negative refractive index layer 130 is 0.7.

Respective points shown with a box (■) in each of the graphs of FIGS. 9A to 9D are examples of light having different wavelengths, and represent 365 nm, 405 nm and 436 nm. As a point is close to a point of 0 in the horizontal axis in each graph, the point is close to the quasi-bound mode. Accordingly, it can be seen that in the range of about 0.7 to about 0.99 of the metal filling factor of the metal contained in the negative refractive index layer 130, as the metal filling factor of the contained metal is small, the frequency range of the quasi-bound mode of the graph of FIG. 3 is increased. However, when the metal filling factor of the metal contained in the negative refractive index layer 130 is smaller than about 0.7, a phenomenon in which the frequency range of the quasi-bound mode is increased is generated.

As described above, when the negative refractive index layer 130 is the metal-dielectric composite, it is possible to adjust the position and the range of the wavelength range of the quasi-bound mode of the surface plasmon by adjusting the metal filling factor of the metal. In exemplary embodiments, for example, when the metal filling factor of the metal contained in the negative refractive index layer 130 is about 0.7 to about 0.99 in a case where the wavelength range of the light used by the light exposer is from about 365 nm to about 436 nm, the quasi-bound mode of the surface plasmon may overlap the wavelength range of the light used by the light exposer.

Next, an exemplary embodiment of a method of making the quasi-bound mode of the surface plasmon overlap the wavelength range of the light used by the light exposer by adjusting the material property of the first dielectric layer 120 and/or the second dielectric layer 140 of the exemplary embodiment of the photomask for exposure according to the invention will be described with reference to FIGS. 10A to 10D together with the aforementioned drawings.

Figure 10A:
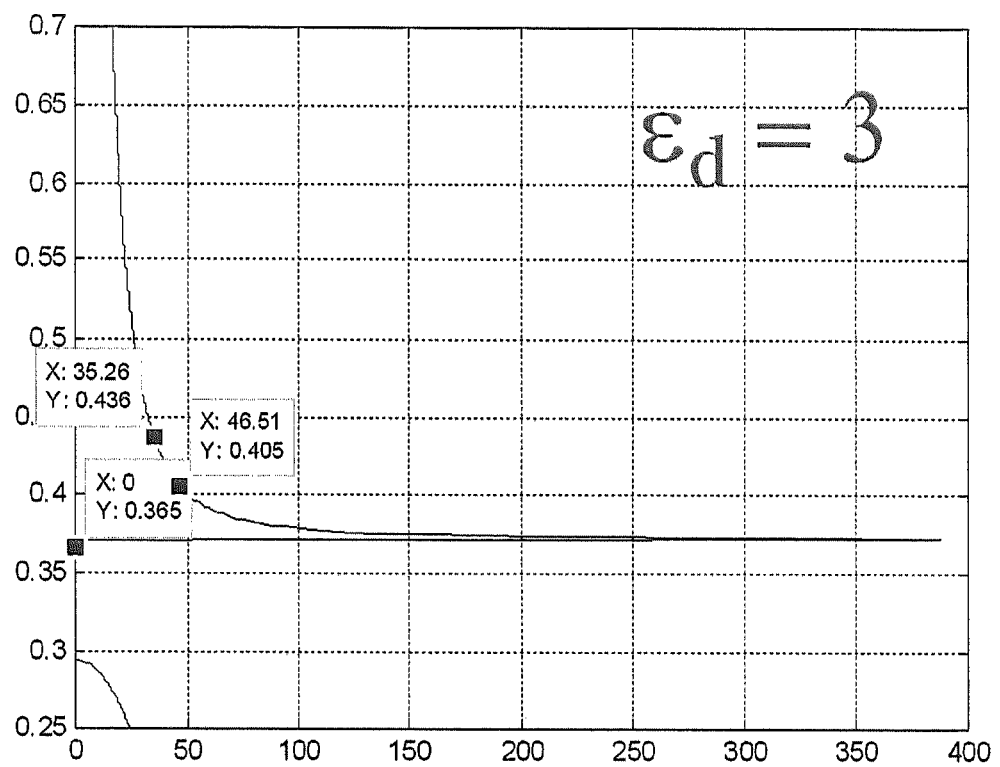
FIGS. 10A to 10D are distribution graphs of surface plasmon according to values of permittivity of a dielectric included in an exemplary embodiment of the photomask for exposure according to the invention.
Figure 10B:
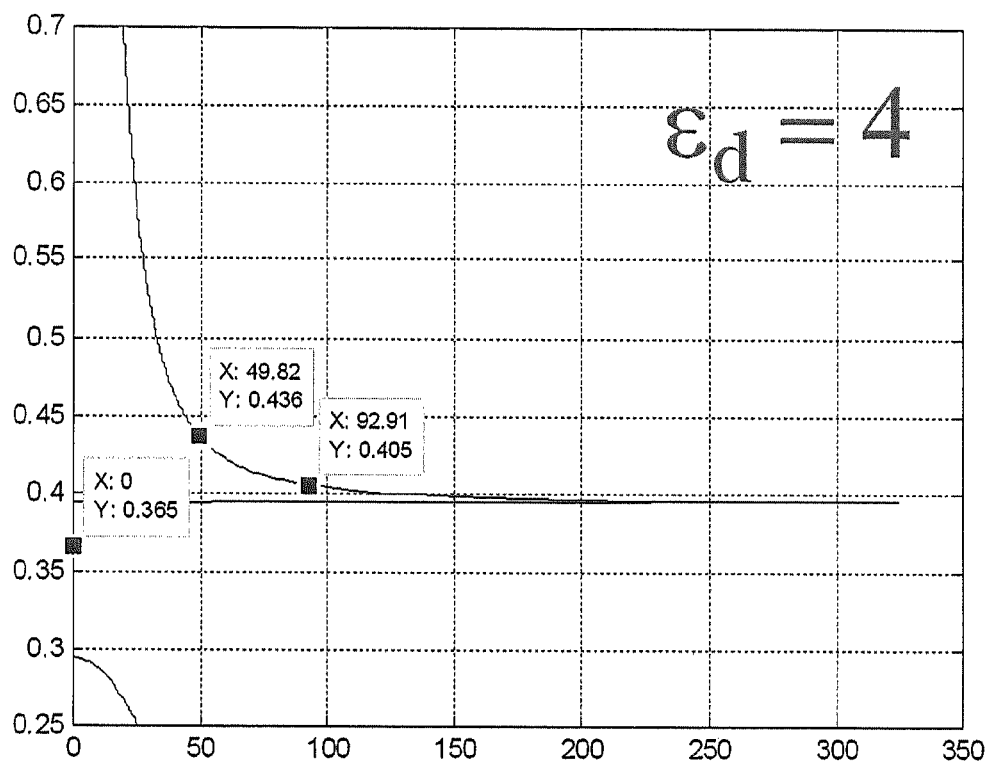
Figure 10C:
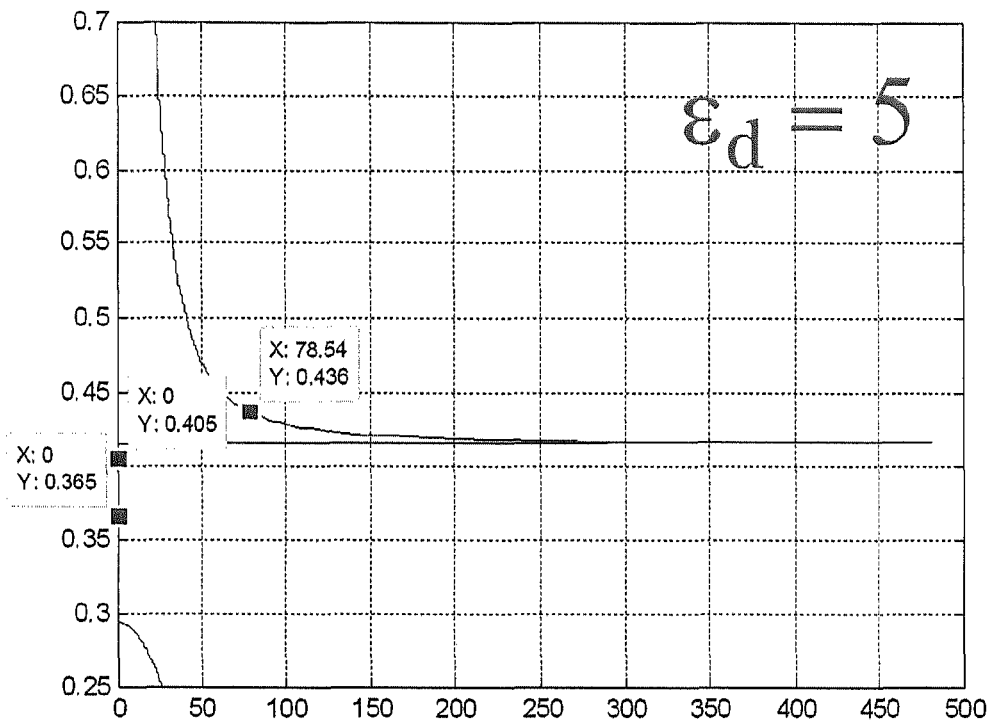
Figure 10D:
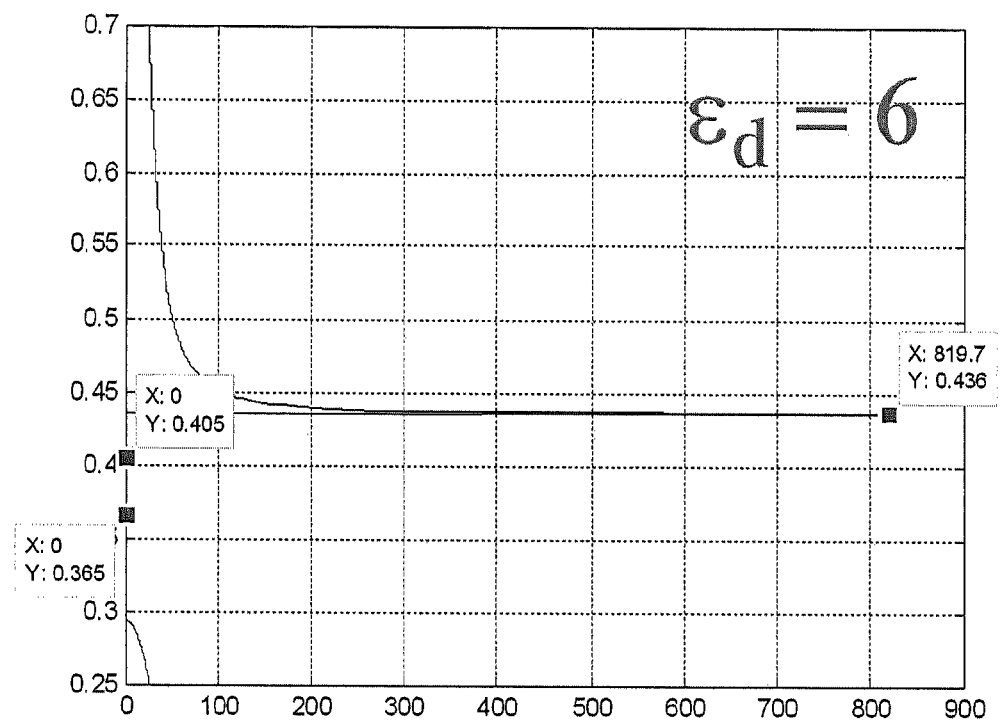

FIGS. 10A to 10D are distribution graphs of the surface plasmon according to value of permittivity $\in_d$ of a dielectric material included in the exemplary embodiment of the photomask for exposure according to the invention, respectively. FIG. 10A illustrates permittivity $\in_d$ of the first dielectric layer 120 or the second dielectric layer 140 is about 3, FIG. 10B illustrates permittivity $\in_d$ of the first dielectric layer 120 or the second dielectric layer 140 is about 4, FIG. 10C illustrates permittivity $\in_d$ of the first dielectric layer 120 or the second dielectric layer 140 is about 5, and FIG. 10D illustrates permittivity $\in_d$ of the first dielectric layer 120 or the second dielectric layer 140 is about 6.

Respective points shown with a box (■) in each of the graphs of FIGS. 10A to 10D are examples of light having different wavelengths, and represent 365 nm, 405 nm and 436 nm. As a point is close to a point of 0 in the horizontal axis in each graph, the point is close to the quasi-bound mode. Accordingly, as the permittivity $\in_d$ of the first dielectric layer 120 or the second dielectric layer 140 is increased, the frequency range of the quasi-bound mode is decreased. Particularly, when the permittivity $\in_d$ of the first dielectric layer 120 or the second dielectric layer 140 is about 4, the wavelength of 365 nm is included in the quasi-bound mode, and when the permittivity $\in_d$ of the first dielectric layer 120 or the second dielectric layer 140 is equal to or larger than 5, the wavelengths of 405 nm and 436 nm are also included in the quasi-bound mode.

This may be confirmed from aforementioned Equation 1. That is, the second frequency $\omega_{sp}$ is decreased as the permittivity $\in_d$ is increased, the wavelength range of the quasi-bound mode is expanded toward a low frequency or a high wavelength. Accordingly, the wavelengths of 365 nm, 405 nm and 436 nm are included in the wavelength range of the quasi-bound mode, so that it is possible to form a fine pattern at a relatively remote exposure distance. Particularly, when the permittivity $\in_d$ of the first dielectric layer 120 or the second dielectric layer 140 is equal to or larger than about 4, the exposure in the quasi-bound mode is possible even in the wavelength range used by the existing light exposer.

As described above, the first dielectric layer 120 and/or the second dielectric layer 140 may be a dielectric composite including two or more dielectric materials in order to adjust the permittivity $\in_d$ of the first dielectric layer 120 and/or the second dielectric layer 140. The choice of dielectric material and the ratio of the dielectric material of the dielectric composite may be variously adjusted so that the wavelength range of the light of the light exposer overlaps the quasi-bound mode.

An exemplary embodiment of a method of manufacturing a photomask for exposure according to the invention will be described with reference to FIGS. 11 to 13.

Figure 11:
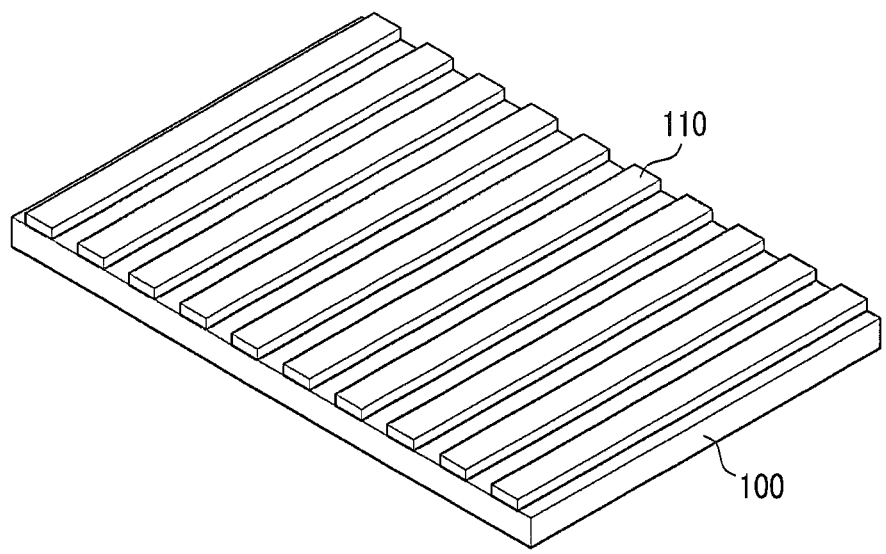
FIGS. 11 to 13 are perspective views sequentially illustrating an exemplary embodiment of a method of manufacturing a photomask for exposure according to the invention, respectively.
Figure 12:
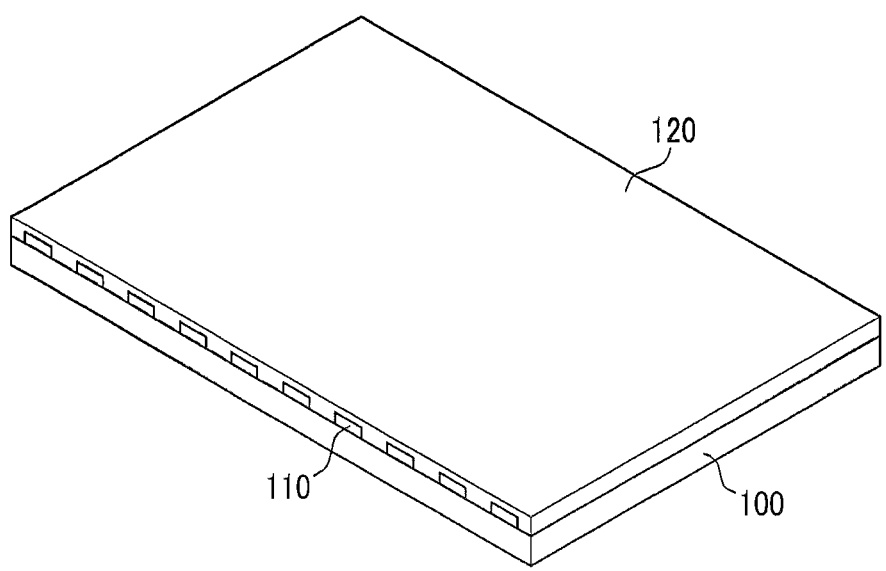
Figure 13:
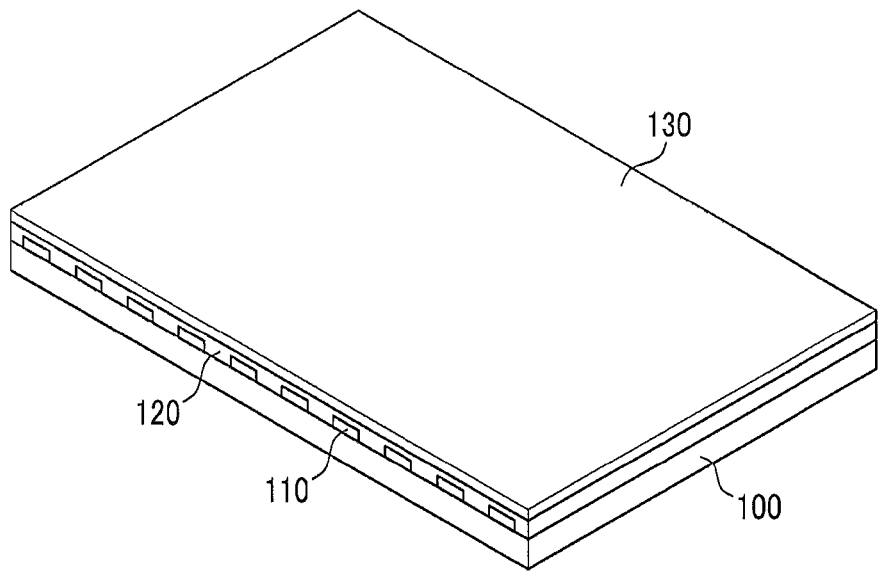

FIGS. 11 to 13 are perspective views sequentially illustrating an exemplary embodiment of a method of manufacturing the photomask for exposure according to the invention.

First, referring to FIG. 11, the light blocking pattern layer 110 is formed (e.g., provided) on the substrate 110 which includes a transparent material, such as glass and quartz. The light blocking pattern layer 110 may be formed of an opaque material, such as metal including chromium (Cr), and may have various shapes according to a shape of a pattern to be formed by using the photomask for exposure. In the illustrated exemplary embodiment, for example, the light blocking pattern layer 110 includes a plurality of patterns elongated in a first direction, and arranged in a second direction. The plurality of patterns are in a same layer of the photomask.

Next, referring to FIG. 12, one or more dielectric materials, such as PMMA and silicon oxide (SiOx), are stacked on the substrate 100 and the light blocking pattern layer 110 such as by a method of spin coating and the like, to form the first dielectric layer 120. The first dielectric layer 120 may have a thickness equal to or larger than about 10 nm and equal to or smaller than 500 nm, but is not limited thereto. The first dielectric layer 120 may have a thickness similar to that of the negative refractive index layer 130. In the illustrated exemplary embodiment, the first dielectric layer 120 is disposed between adjacent patterns of the light blocking pattern layer 110, and above an upper surface of the patterns, such that the first dielectric layer 120 has a substantially flat upper surface. The first dielectric layer 110 may be provided on an entirety of the substrate 100 to cover the light blocking pattern layer 110 in a plan view.

Next, referring to FIG. 13, a thin film formed of metal or a metal composite is stacked on the first dielectric layer 120 by a method, such as E-beam evaporation to form the negative refractive index layer 130. An example of the metal includes silver (Ag), gold (Au), copper (Cu), aluminum (Al), beryllium (Be), chromium (Cr), nickel (Ni), palladium (Pd), platinum (Pt), titanium (Ti) and tungsten (W). A thickness of the negative refractive index layer 130 may be equal to or larger than about 10 nm and equal to or smaller than about 150 nm, but is not limited thereto. When the negative refractive index layer 130 is formed of the metal composite, two or more metals and/or a dielectric material, such as an additional metal, may also be simultaneously stacked.

Next, as illustrated in aforementioned FIG. 2, one or more dielectric materials, such as PMMA and silicon oxide (SiOx), may be stacked on the negative refractive index layer 130 by a method of spin coating and the like to form the second dielectric layer 140. The second dielectric layer 140 may have a thickness equal to or larger than about 10 nm and equal to or smaller than about 500 nm, and may have a thickness similar to that of the negative refractive index layer 130.

Now, an exemplary embodiment of a method of forming a pattern through exposure by using a photomask for exposure according to the invention will be described with reference to FIGS. 14 to 17.

FIGS. 14 to 17 are perspective views sequentially illustrating an exemplary embodiment of a method of forming a pattern through exposure by using a photomask for exposure according to the invention.

Figure 14:
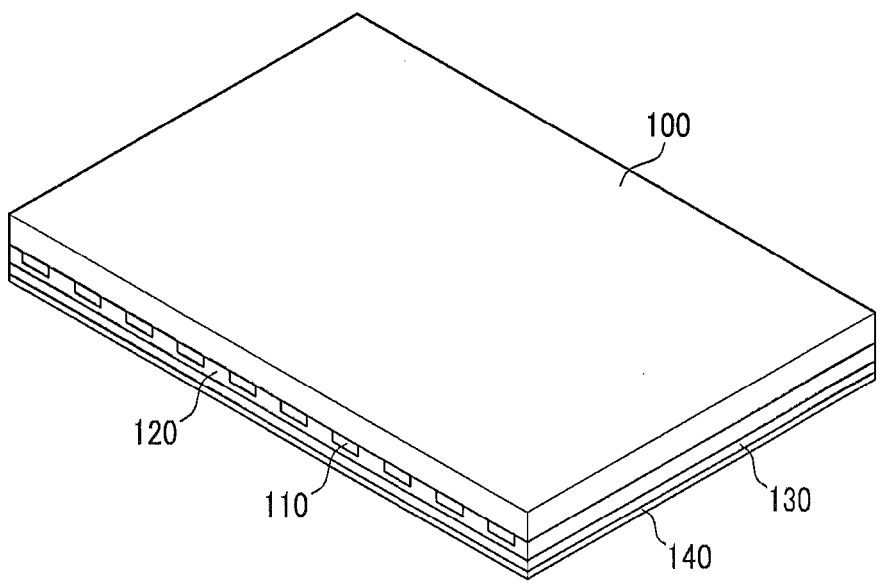
FIGS. 14 to 17 are perspective views sequentially illustrating an exemplary embodiment of a method of forming a pattern through exposure by using the photomask for exposure according to the invention.

First, when a light exposer is positioned on the photomask for exposure in an exposure process, an operation target is positioned under the light exposer. Referring to FIG. 14, it is illustrated that the aforementioned substrate 100 of the photomask for exposure illustrated in FIG. 1 or 2 is positioned at an upper side with respect to the negative refractive index layer 130 at a lower side. It is illustrated that the photomask for exposure illustrated in FIG. 14 is the aforementioned photomask for exposure illustrated in FIG. 2, but may be the photomask for exposure illustrated in FIG. 1. The light exposer used in the exemplary embodiment of the process of forming a fine pattern according to the invention may use light of a single wavelength or a complex wavelength, and the wavelength range of the light may be at least one of G line (435 nm), H line (405 nm), and I (365 nm) line.

Figure 15:
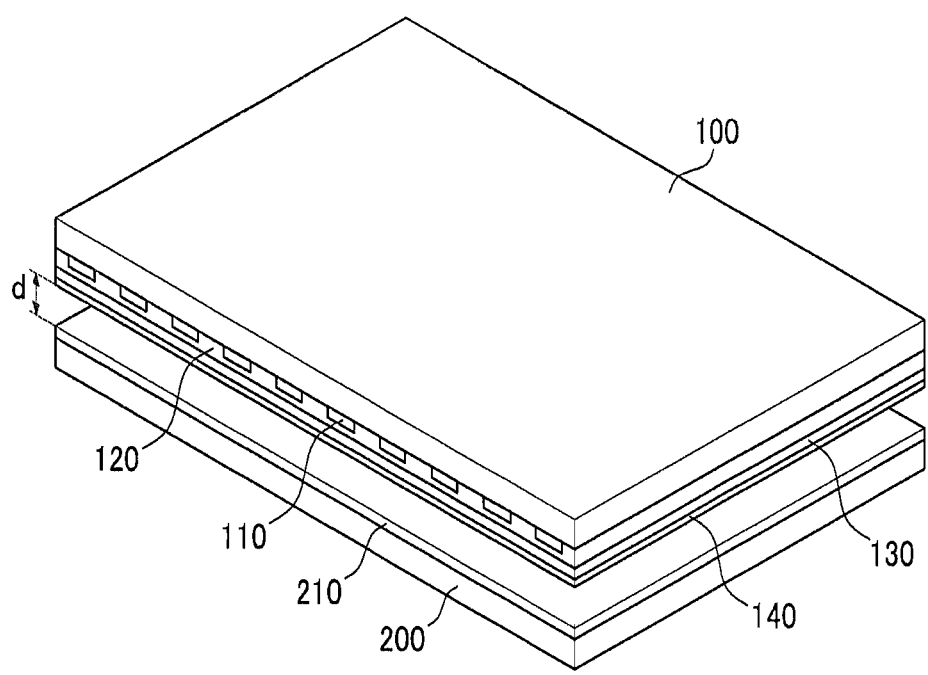

Next, referring to FIG. 15, a target substrate 200 that is a target for an operation and a photoresist film 210 coated on the target substrate 200 are positioned under the photomask for exposure. A layer to be patterned exists between the target substrate 200 and the photoresist film 210, and illustration thereof will be omitted for convenience's sake.

In the exemplary embodiment of the process of forming the pattern according to the invention, the photomask for exposure and the photoresist film 210 may be spaced apart from each other at an interval of an exposure distance 'd'. The exposure distance 'd' may be, for example, larger than 0 μm and equal to or smaller than about 35 μm.

Figure 16:
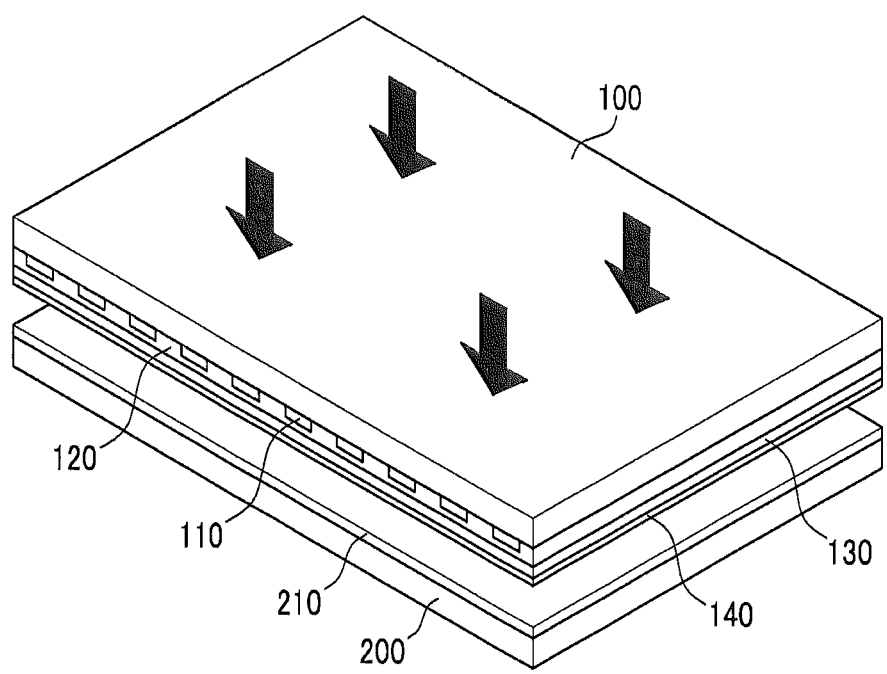

Next, as illustrated in FIG. 16, the light exposer (not illustrated) positioned at the upper side irradiates light to the photomask for exposure. Then, the light is irradiated (shown by the downward arrows) to the photoresist film 210 through a transmission region of the photomask in which the light blocking pattern layer 110 of the photomask for exposure is not formed. Surface plasmon may be generated along a boundary surface between the first dielectric layer 120 and the negative refractive index layer 130 and/or between the second dielectric layer 140 and the negative refractive index layer 130.

Where the exposure is performed in the quasi-bound mode of the surface plasmon through the exemplary embodiment of the photomask for exposure according to the invention, evanescent wave transmittable to a relatively remote distance may be transmitted to the photoresist film 210 on the target substrate 200 that is the target for the operation.

Figure 17:
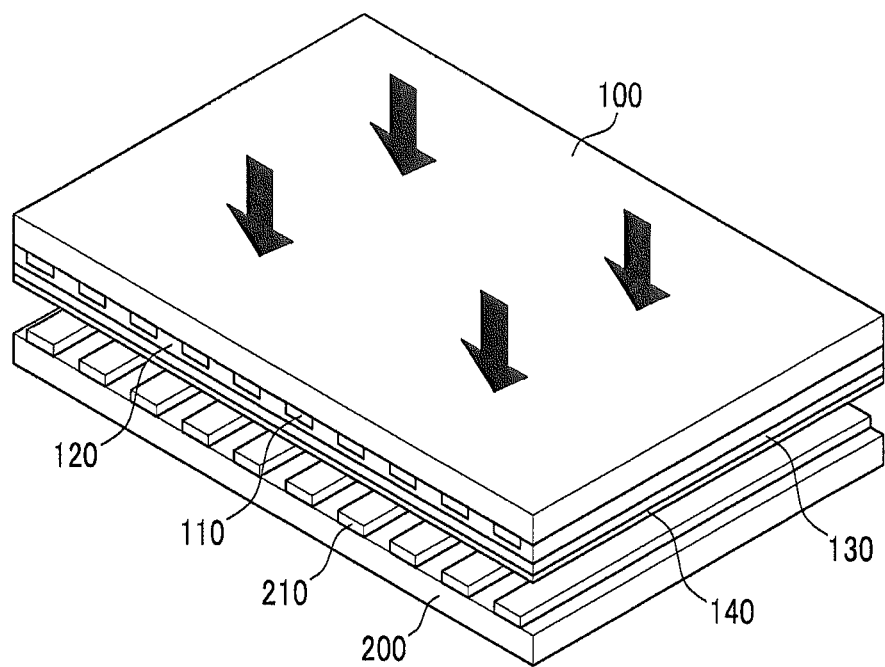

Next, referring to FIG. 17, when the exposed photoresist film 210 is developed, even in a case where the exposure distance 'd' is equal to or larger than 0, it is possible to form a fine photoresist pattern having an excellent quality exceeding a resolution limit of the light exposer.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A photomask for exposure, comprising:
a transparent substrate;
a light blocking pattern layer on the transparent substrate, the light blocking pattern defining a space between adjacent patterns and through which the transparent substrate is exposed;
a first dielectric layer on the light blocking pattern layer, the first dielectric layer contacting the transparent substrate exposed between the adjacent patterns and comprising a first dielectric material; and
a negative refractive index layer on the first dielectric layer and comprising a metal,
wherein a surface plasmon quasi-bound mode of the photomask for exposure overlaps a wavelength range of a light source of a light exposer which irradiates light to the photomask.

2. The photomask for exposure of claim 1, wherein:
the negative refractive index layer comprises a metal composite comprising two or more metals.

3. The photomask for exposure of claim 2, wherein:
plasma frequencies of the two or more metals are different from each other.

4. The photomask for exposure of claim 3, wherein:
the wavelength range of the light source comprises a range from about 365 nanometers to about 436 nanometers.

5. The photomask for exposure of claim 4, further comprising:
a second dielectric layer on the negative refractive index layer and comprising a second dielectric material.

6. The photomask for exposure of claim 5, wherein:
permittivity of the first dielectric layer or the second dielectric layer is equal to or larger than about 4.

7. The photomask for exposure of claim 1, wherein:
the negative refractive index layer further comprises a third dielectric material.

8. The photomask for exposure of claim 7, wherein:
a metal filing factor of the metal of the negative refractive index layer is about 0.7 to about 0.99.

9. The photomask for exposure of claim 8, wherein:
the wavelength range of the light source comprises a range from about 365 nanometers to about 436 nanometers.

10. The photomask for exposure of claim 9, further comprising:
a second dielectric layer on the negative refractive index layer and comprising a second dielectric material.

11. The photomask for exposure of claim 10, wherein:
permittivity of the first dielectric layer or the second dielectric layer is equal to or larger than about 4.

12. The photomask for exposure of claim 1, wherein:
permittivity of the first dielectric layer is equal to or larger than about 4.

13. The photomask for exposure of claim 12, wherein:
the wavelength range of the light source comprises a range from about 365 nanometers to about 436 nanometers.

14. The photomask for exposure of claim 13, further comprising:
a second dielectric layer on the negative refractive index layer and comprising a second dielectric material.

15. The photomask for exposure of claim 14, wherein:
permittivity of the second dielectric layer is equal to or larger than about 4.

16. The photomask for exposure of claim 1, wherein:
the wavelength range of the light source comprises a range from about 365 nanometers to about 436 nanometers.

17. A method of forming a pattern by using a photomask for exposure, the method comprising:
providing the photomask for exposure between a target substrate on which a photoresist film is coated, and a light exposer; and
irradiating light of a light source of the light exposure onto the photoresist film through the photomask for exposure,
wherein the photomask for exposure comprises:
a transparent substrate;
a light blocking pattern layer on the transparent substrate;
a first dielectric layer directly disposed on the transparent substrate through a space defined in the light blocking pattern layer, and comprising a first dielectric material; and
a negative refractive index layer on the first dielectric layer and comprising a metal,
wherein a surface plasmon quasi-bound mode of the photomask for exposure overlaps a wavelength range of the light source of the light exposer.

18. The method of forming a pattern by using a photomask for exposure of claim 17, wherein:
the negative refractive index layer comprises a metal composite comprising two or more metals.

19. The method of forming a pattern by using a photomask for exposure of claim 17, wherein:
the negative refractive index layer further comprises a second dielectric material.

20. The method of forming a pattern by using a photomask for exposure of claim 17, wherein:
permittivity of the first dielectric layer is equal to or larger than about 4.

* * * * *